(12) United States Patent
Nishida et al.

(10) Patent No.: US 10,858,726 B2
(45) Date of Patent: Dec. 8, 2020

(54) VAPOR DEPOSITION MASK, VAPOR DEPOSITION MASK MANUFACTURING METHOD, AND ORGANIC SEMICONDUCTOR ELEMENT MANUFACTURING METHOD

(71) Applicant: HON HAI PRECISION INDUSTRY CO., LTD., New Taipei (TW)

(72) Inventors: Koshi Nishida, Osaka (JP); Kozo Yano, Osaka (JP); Katsuhiko Kishimoto, Osaka (JP)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 173 days.

(21) Appl. No.: 16/065,863

(22) PCT Filed: Jul. 25, 2016

(86) PCT No.: PCT/JP2016/071765
§ 371 (c)(1),
(2) Date: Jun. 25, 2018

(87) PCT Pub. No.: WO2017/110123
PCT Pub. Date: Jun. 29, 2017

(65) Prior Publication Data
US 2020/0165714 A1 May 28, 2020

(30) Foreign Application Priority Data
Dec. 25, 2015 (JP) ................................. 2015-253888

(51) Int. Cl.
*H01L 51/00* (2006.01)
*H01L 51/50* (2006.01)
(Continued)

(52) U.S. Cl.
CPC ........ *C23C 14/042* (2013.01); *H01L 51/0011* (2013.01); *C23C 14/24* (2013.01)

(58) Field of Classification Search
CPC .................................................. H01L 51/0011
See application file for complete search history.

(56) References Cited

U.S. PATENT DOCUMENTS 6,099,939 A * 8/2000 Mittal ................... C23C 14/024
257/E21.576
2014/0199808 A1 7/2014 Sugimoto et al.
(Continued)

FOREIGN PATENT DOCUMENTS

JP 2013-124372 A 6/2013
JP 2013-209710 A 10/2013
(Continued)

*Primary Examiner* — Herve-Louis Y Assouman
(74) *Attorney, Agent, or Firm* — ScienBiziP, P.C.

(57) ABSTRACT

A vapor deposition mask (100) includes a resin layer (10) having a first primary surface (11) and a second primary surface (12), and having a plurality of openings (13), and a metal layer (20) having a third primary surface (21) and a fourth primary surface (22), and provided on the first primary surface of the resin layer so that the fourth primary surface is located on the resin layer side, wherein the metal layer is shaped so that the plurality of openings are exposed therethrough. A portion of the first primary surface of the resin layer that is in contact with the metal layer, a portion of the first primary surface of the resin layer that is not in contact with the metal layer, and the third primary surface of the metal layer each include a rough surface region having a depressed/protruding shape.

15 Claims, 8 Drawing Sheets

(51) Int. Cl.
  *C23C 14/04* (2006.01)
  *C23C 14/24* (2006.01)

(56) References Cited

U.S. PATENT DOCUMENTS

2014/0377903 A1* 12/2014 Takeda .................. C23C 16/042
                                                           438/99
2017/0275749 A1*  9/2017 Sato .................... H01L 21/0334

FOREIGN PATENT DOCUMENTS

| | | | | |
|---|---|---|---|---|
| JP | 2014-205457 | * | 10/2014 | ............. H01L 50/12 |
| JP | 2015-148002 A | | 8/2015 | |
| WO | 2015/002129 A1 | | 1/2015 | |

\* cited by examiner

VAPOR DEPOSITION MASK, VAPOR DEPOSITION MASK MANUFACTURING METHOD, AND ORGANIC SEMICONDUCTOR ELEMENT MANUFACTURING METHOD

TECHNICAL FIELD

The present invention relates to a vapor deposition mask, and particularly to a vapor deposition mask having a structure in which a resin layer and a metal layer are layered together. The present invention also relates to a method for manufacturing a vapor deposition mask and a method for manufacturing an organic semiconductor device.

BACKGROUND ART

In recent years, organic EL (Electro Luminescence) display devices have been drawing public attention as a display of the next generation. With organic EL display devices that are currently mass-produced, the formation of an organic EL layer is primarily done by using a vacuum vapor deposition method.

Typically, a mask made of a metal (a metal mask) is used as the vapor deposition mask. However, with the increasing definition of organic EL display devices, it is becoming difficult to precisely form a vapor deposition pattern using a metal mask. This is because it is difficult with current metal processing techniques to precisely form small openings corresponding to a short pixel pitch (e.g., about 10 to 20 μm) in a metal plate (e.g., a thickness of about 100 μm) to be the metal mask.

In view of this, a vapor deposition mask (hereinafter referred to also as a "layered mask") having a structure in which a resin layer and a metal layer are layered together has been proposed in the art as a vapor deposition mask for forming a vapor deposition pattern with a high definition. For example, Patent Document No. 1 discloses a vapor deposition mask having a structure in which a resin film is layered with a hold member, which is a metal magnetic member. A plurality of openings corresponding to an intended vapor deposition pattern are formed in the resin film. Openings whose size is larger than the openings of the resin film are formed in the hold member so that the openings of the resin film are exposed therethrough. Therefore, when the vapor deposition mask of Patent Document No. 1 is used, the vapor deposition pattern is formed corresponding to the plurality of openings of the resin film. Even small openings can be formed with a high precision in a resin film that is thinner than an ordinary metal plate used for a metal mask.

CITATION LIST

Patent Literature

Japanese Laid-Open Patent Publication No. 2013-124372

SUMMARY OF INVENTION

Technical Problem

During vacuum vapor deposition, the vapor deposition material deposits on the surface of the vapor deposition mask that is on the vapor deposition source side. When the deposited vapor deposition material comes off, it contaminates the vapor deposition source. Therefore, it is necessary to clean the surface of the vapor deposition mask before the vapor deposition material deposits to such a thickness that it may come off (i.e., at predetermined cycles).

However, since a layered mask as proposed in Patent Document No. 1 includes a resin layer, it has a poorer cleaning tolerance than a metal mask. Therefore, the mask life of a layered mask is shorter than a metal mask.

The present invention has been made in view of the above, and an object thereof is to provide a layered vapor deposition mask that can suitably be used for forming a vapor deposition pattern having a high definition and whose cleaning cycle can be set to be longer than that with conventional methods. Another object of the present invention is to provide a manufacturing method by which such a vapor deposition mask can suitably be manufactured, and a method for manufacturing an organic semiconductor device using such a vapor deposition mask.

Solution to Problem

A vapor deposition mask according to an embodiment of the present invention is a vapor deposition mask including: a resin layer having a first primary surface and a second primary surface, and having a plurality of openings; and a metal layer having a third primary surface and a fourth primary surface, and provided on the first primary surface of the resin layer so that the fourth primary surface is located on the resin layer side, wherein the metal layer is shaped so that the plurality of openings are exposed therethrough, wherein: a portion of the first primary surface of the resin layer that is in contact with the metal layer, a portion of the first primary surface of the resin layer that is not in contact with the metal layer, and the third primary surface of the metal layer each include a rough surface region having a depressed/protruding shape.

In one embodiment, the fourth primary surface of the metal layer includes a rough surface region having a depressed/protruding shape.

In one embodiment, the depressed/protruding shape of the rough surface region of the portion of the first primary surface of the resin layer that is in contact with the metal layer and the depressed/protruding shape of the rough surface region of the fourth primary surface of the metal layer are complementary to each other.

In one embodiment, the second primary surface of the resin layer does not include a rough surface region having a depressed/protruding shape.

In one embodiment, the rough surface region of the portion of the first primary surface of the resin layer that is in contact with the metal layer, the rough surface region of the portion of the first primary surface of the resin layer that is not in contact with the metal layer, and the rough surface region of the third primary surface of the metal layer each have a surface roughness Ra of 0.1 μm or more.

A method for manufacturing a vapor deposition mask according to an embodiment of the present invention is a method for manufacturing a vapor deposition mask including a resin layer having a plurality of openings and a metal layer provided on the resin layer and shaped so that the plurality of openings are exposed therethrough, the method including the steps of: providing a support substrate having a first primary surface and a second primary surface, wherein at least the first primary surface, of the first primary surface and the second primary surface, includes a rough surface region having a depressed/protruding shape; forming a resin layer having a surface onto which the depressed/protruding shape of the rough surface region of the first primary surface has been transferred, by applying a resin material on the first primary surface of the support substrate; and forming a plurality of openings in the resin layer.

In one embodiment, the support substrate is a metal plate of which the first primary surface and the second primary surface each include the rough surface region; and the method for manufacturing a vapor deposition mask of the present invention further includes, after the step of forming the resin layer, a step of patterning the metal plate so as to obtain a metal layer having a predetermined shape.

In one embodiment, the method for manufacturing a vapor deposition mask of the present invention further includes the steps of: removing the resin layer from the support substrate; providing a metal plate having a third primary surface and a fourth primary surface, wherein the third primary surface and the fourth primary surface each include a rough surface region having a depressed/protruding shape; attaching the resin layer that has been removed from the support substrate to the metal plate so that the surface onto which the depressed/protruding shape has been transferred is located on the metal plate side; and patterning the metal plate so as to obtain a metal layer having a predetermined shape.

In one embodiment, the support substrate is a glass substrate.

A method for manufacturing an organic semiconductor device according to an embodiment of the present invention includes the step of vapor-depositing an organic semiconductor material on a work by using a vapor deposition mask having any of the configurations set forth above.

Advantageous Effects of Invention

An embodiment of the present invention provides a layered vapor deposition mask that can suitably be used for forming a vapor deposition pattern having a high definition and whose cleaning cycle can be set to be longer than that with conventional methods.

DESCRIPTION OF EMBODIMENTS

An embodiment of the present invention will now be described with reference to the drawings. Note that the present invention is not limited to the following embodiment.

(Structure of Vapor Deposition Mask)

Figure 1:
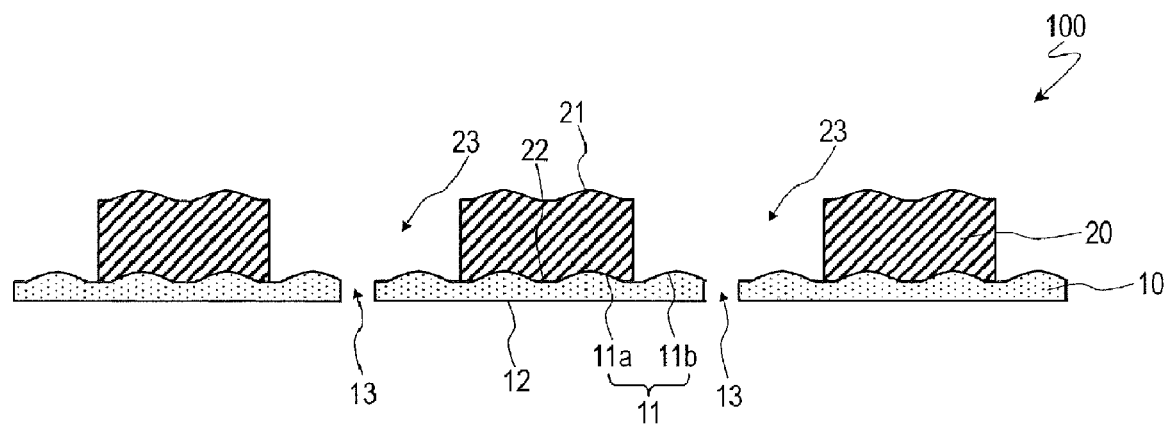
FIG. 1 A cross-sectional view schematically showing a vapor deposition mask 100 according to an embodiment of the present invention, showing a cross section taken along line 1A-1A of FIG. 2.
Figure 2:
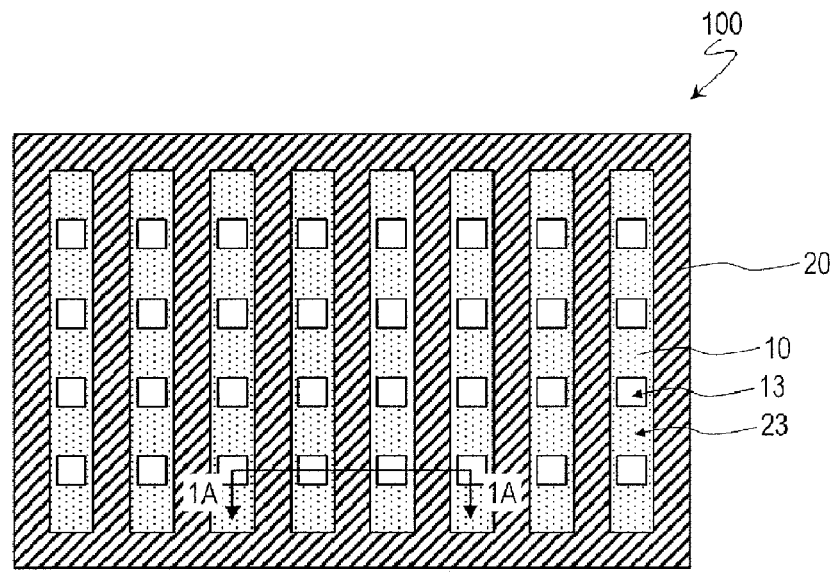
FIG. 2 A plan view schematically showing the vapor deposition mask 100.

Referring to FIG. 1 and FIG. 2, a vapor deposition mask 100 according to an embodiment of the present invention will be described. FIG. 1 and FIG. 2 are a cross-sectional view and a plan view each schematically showing the vapor deposition mask 100. FIG. 1 shows a cross section taken along line 1A-1A of FIG. 2.

As shown in FIG. 1 and FIG. 2, the vapor deposition mask 100 includes a resin layer 10, and a metal layer 20 provided on the resin layer 10. That is, the vapor deposition mask 100 has a structure in which the resin layer 10 and the metal layer 20 are layered together (a structure in which the resin layer 10 is supported on the metal layer 20). As will be described later, when performing a vapor deposition step using the vapor deposition mask 100, the vapor deposition mask 100 is arranged so that the metal layer 20 is located on the vapor deposition source side and the resin layer 10 is on the work (vapor deposition object) side.

The resin layer 10 has two primary surfaces 11 and 12 opposite to each other. Hereinbelow, one (the primary surface 11) of the two primary surfaces 11 and 12 that is closer to the metal layer 20 may be referred to as the "first primary surface", and the primary surface 12 that is farther away from the metal layer 20 as the "second primary surface".

The resin layer 10 includes a plurality of openings 13. The size, shape and position of the plurality of openings 13 correspond to the vapor deposition pattern to be formed on the work. In the example shown in FIG. 2, the plurality of openings 13 are arranged in a matrix pattern.

For example, polyimide can suitably be used as the material of the resin layer 10. Polyimide is desirable in terms of strength, chemical resistance and heat resistance. Other resin materials such as polyethylene terephthalate (PET) may be used as the material of the resin layer 10.

There is no particular limitation on the thickness of the resin layer 10. Note however that if the resin layer 10 is too thick, portions of the vapor deposition film may be thinner than an intended thickness (this is called "shadowing"). The reason why shadowing occurs will later be described in detail. In order to suppress the occurrence of shadowing, the thickness of the resin layer 10 is preferably 25 µm or less. When the resin layer 10 is too thin, it may be difficult to form a rough surface region as will be described later on the surface of the resin layer 10 by a simple method. In view of preferably forming a rough surface region, it is preferred that the thickness of the resin layer 10 is 3 µm or more. Also in view of the strength and the cleaning tolerance of the resin layer 10 itself, it is preferred that the thickness of the resin layer 10 is 3 µm or more.

The metal layer 20 has two primary surfaces 21 and 22 opposite to each other. Hereinbelow, one (the primary surface 21) of the two primary surfaces 21 and 22 that is farther away from the resin layer 10 may be referred to as the "third primary surface", and the primary surface 22 that is closer to the resin layer 10 as the "fourth primary surface". That is, the metal layer 20 is provided on the first primary surface 11 of the resin layer 10 so that the fourth primary surface 22 is located on the resin layer 10 side.

The metal layer 20 is shaped so that plurality of openings 13 of the resin layer 10 are exposed. Herein, a plurality of slits (openings) 23 are formed in the metal layer 20. In the example shown in FIG. 2, the slits 23, each extending in the column direction, are arranged in the row direction, and the metal layer 20 as a whole is ladder shaped. As seen from the direction normal to the vapor deposition mask 100, each slit 23 has a size larger than each opening 13 of the resin layer 10, and two or more the opening 13 (needless to say, the number of openings is not limited to that shown in FIG. 2) are located in each slit 23.

Any of various metal materials may be used as the material of the metal layer 20. With the vapor deposition mask 100 of the present embodiment, the metal layer 20 functions as a support. Therefore, the thermal expansion coefficient of the metal layer 20 is preferably as small as possible, and it is preferably specifically less than $6 \times 10^{-6}$/° C. When the metal layer 20 is a magnetic member, it is possible to easily hold and secure the vapor deposition mask 100 by using a magnetic chuck in the vapor deposition step. For example, an invar may be used as the material of the metal layer 20, which has a small thermal expansion coefficient and is a magnetic member. Needless to say, a metal material other than an invar (e.g., some stainless steels, and aluminum alloys, etc.) may be used.

Since the metal layer 20 is shaped as described above, the first primary surface 11 of the resin layer 10, as seen from the direction normal to the vapor deposition mask 100, includes a portion (non-exposed portion) 11a that is covered by the metal layer 20 and is not exposed, and a portion (exposed portion) 11b that is exposed through the slit 23. The non-exposed portion 11a is a portion that is in contact with the metal layer 20, and the exposed portion 11b is a portion that is not in contact with the metal layer 20.

There is no particular limitation on the thickness of the metal layer 20. Note however that when the metal layer 20 is too thick, the metal layer 20 may bend by its own weight or shadowing may occur. In view of suppressing the bending by its own weight and shadowing, the thickness of the metal layer 20 is preferably 100 µm or less. When the metal layer 20 is too thin, it may be ruptured or deformed, and it may become hard to handle. Therefore, the thickness of the metal layer 20 is preferably 5 µm or more.

With the vapor deposition mask 100 of the present embodiment, the first primary surface (the surface on the metal layer 20 side) 11 of the resin layer 10 includes a rough surface region having a depressed/protruding shape. More specifically, the non-exposed portion 11a and the exposed portion 11b of the first primary surface 11 each include a rough surface region. Note that minute depressions and protrusions formed in the rough surface region are exaggerated in FIG. 1. In contrast, the second primary surface (the surface on the opposite side from the metal layer 20) 12 of the resin layer 10 does not include a rough surface region. That is, the second primary surface 12 is substantially flat.

The third primary surface (the surface on the opposite side from the resin layer 10) 21 of the metal layer also includes a rough surface region having a depressed/protruding shape. Moreover, the fourth primary surface (the surface on the resin layer 10 side) 22 of the metal layer 20 also includes a rough surface region having a depressed/protruding shape.

As already described above, in the vapor deposition step, the vapor deposition mask 100 is arranged so that the metal layer 20 is located on the vapor deposition source side and the resin layer 10 on the work side. Therefore, the vapor deposition source side surface of the vapor deposition mask 100 is composed of the third primary surface 21 of the metal layer 20 and the exposed portion 11b of the first primary surface 11 of the resin layer 10.

With the vapor deposition mask 100 of the present embodiment, since the third primary surface 21 of the metal layer 20 and the exposed portion 11a of the first primary surface 11 of the resin layer 10 each include a rough surface region, the vapor deposition material deposited on the vapor deposition source side surface of the vapor deposition mask 100 in the vapor deposition step is less likely to come off owing to the anchoring effect from the depressed/protruding shape. Therefore, the cleaning cycle can be set longer as compared with cases (i.e., conventional configurations) in which the vapor deposition source side surface does not include a rough surface region as described above. Therefore, it is possible to elongate the life of the vapor deposition mask 100.

With the vapor deposition mask 100 of the present embodiment, the non-exposed portion 11a of the first primary surface 11 of the resin layer 10 includes a rough surface region. Therefore, it is possible to increase the contact area between the resin layer 10 and the metal layer 20, and it is possible to firmly attach together the resin layer 10 and the metal layer 20.

When the fourth primary surface 22 of the metal layer 20 includes a rough surface region as in the present embodiment, it is possible to further increase the contact area between the resin layer 10 and the metal layer 20, and it is possible to even more firmly attach together the resin layer 10 and the metal layer 20.

It is possible to realize even more firm attachment if the depressed/protruding shape in the rough surface region of the fourth primary surface 22 of the metal layer 20 and the depressed/protruding shape in the rough surface region of the non-exposed portion 11a of the first primary surface 11 of the resin layer 10 are complementary to each other (in conformity with each other). A method for forming complementary depressed/protruding shapes on the surface of the resin layer 10 and on the surface of the metal layer 20 will later be described in detail.

Each of the non-exposed portion 11a and the exposed portion 1ib of the first primary surface 11 of the resin layer 10, and the third primary surface 21 and the fourth primary surface 22 of the metal layer 20 does not need to have a rough surface region across the entirety thereof, but a portion thereof may be a substantially flat region. The advantageous effect described above is realized with the rough surface region provided at least partially. Note however that in view of realizing a sufficient effect from the provision of the rough surface region, the rough surface region is preferably as large as possible, and it is preferred that each of the non-exposed portion 11a and the exposed portion 1ib of the first primary surface 11 of the resin layer 10 and the third primary surface 21 and the fourth primary surface 22 of the metal layer 20 includes a rough surface region generally across the entirety thereof.

Note that while the second primary surface 12 of the resin layer 10 may include a rough surface region, there is no problem even if it does not include a rough surface region as in the present embodiment. When a metal mask is used in the vapor deposition step, there is a concern for a damage on the work due to the metal mask contacting the work. Therefore, it is an idea to reduce such a damage by roughening the work side surface of the metal mask. In contrast, when the vapor deposition mask 100 of the present embodiment is used in the vapor deposition step, only the resin layer 10 comes into contact with the work. Therefore, there is little damage on the work even if the work side surface (the second primary surface 12 of the resin layer 10) does not include a rough surface region. Employing a configuration in which the second primary surface 12 of the resin layer 10 does not include a rough surface region, i.e., a configuration in which the second primary surface 12 is substantially flat, there is no need for a step of forming a rough surface region on the second primary surface 12, and it is therefore possible to simplify the manufacturing process of the vapor deposition mask 100 and reduce the manufacturing cost thereof.

Herein, another configuration example of the vapor deposition mask 100 will be described.

Figure 3:
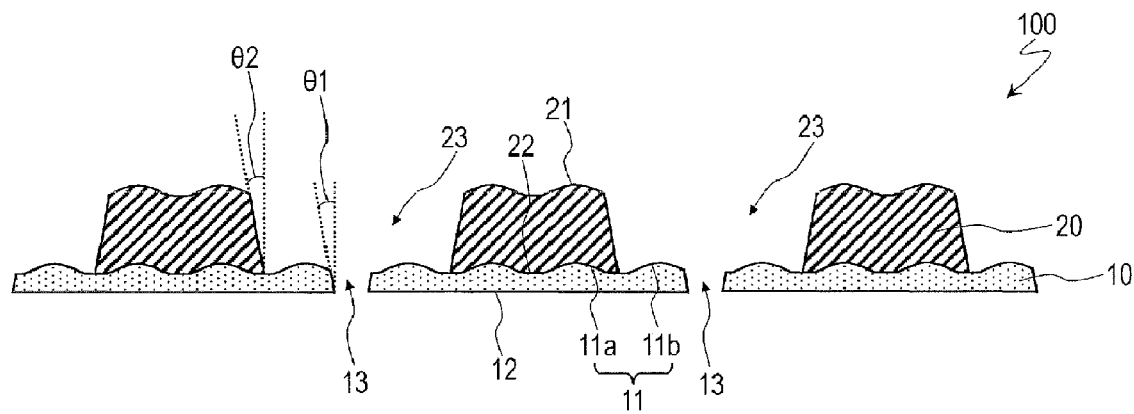
FIG. 3 A cross-sectional view showing another configuration example of the vapor deposition mask 100.

FIG. 3 is a diagram showing an example of a cross-sectional shape of the opening 13 of the resin layer 10 and the slit 23 of the metal layer 20. As shown in FIG. 3, it is preferred that the openings 13 and/or the slits 23 are shaped so as to flare out toward the vapor deposition source side. That is, it is preferred that the inner wall surface of the opening 13 and/or the inner wall surface of the slit 23 are tapered (inclined with respect to the direction normal to the vapor deposition mask 100). With the openings 13 and/or the slits 23 shaped as described above, it is possible to suppress the occurrence of shadowing. There is no particular limitation on the taper angle θ1 of the inner wall surface of the openings 13 (the angle formed between the direction normal to the vapor deposition mask 100 and the inner wall surface of the openings 13) and the taper angle θ2 of the inner wall surface of the slits 23 (the angle formed between the direction normal to the vapor deposition mask 100 and the inner wall surface of the slits 23), but the taper angles are 25° or more and 65° or less, for example.

Figure 4:
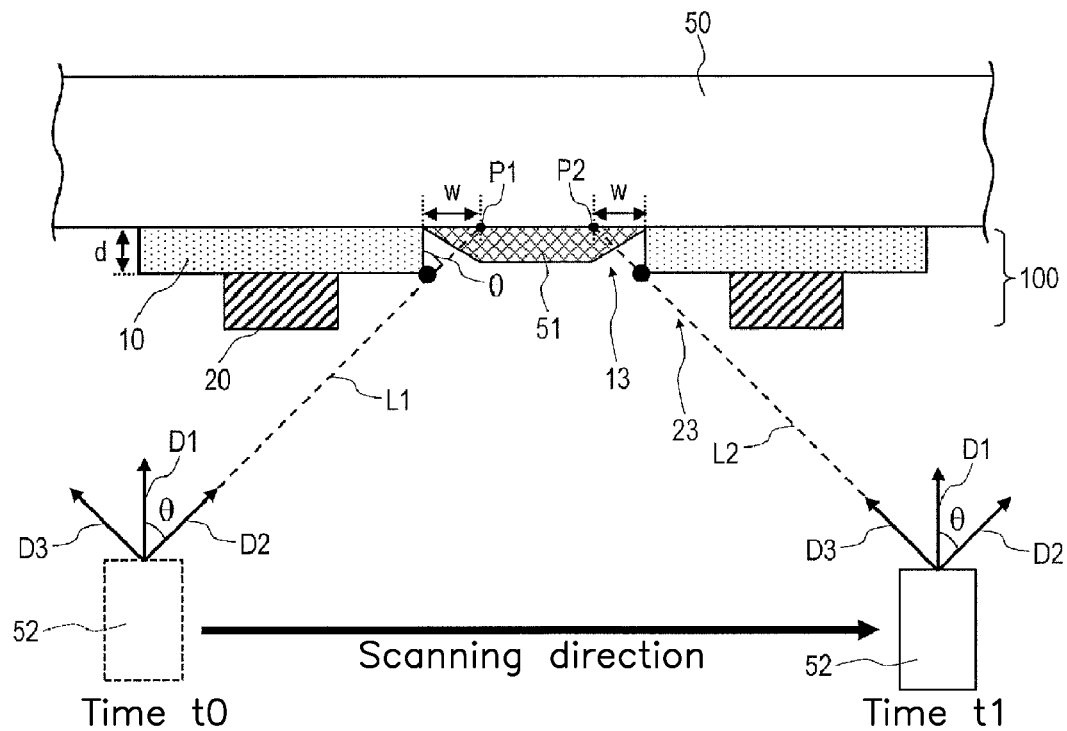
FIG. 4 A diagram schematically showing a vapor deposition step using the vapor deposition mask 100, showing a case in which the inner wall surfaces of an opening 13 and a slit 23 are not tapered.
Figure 5:
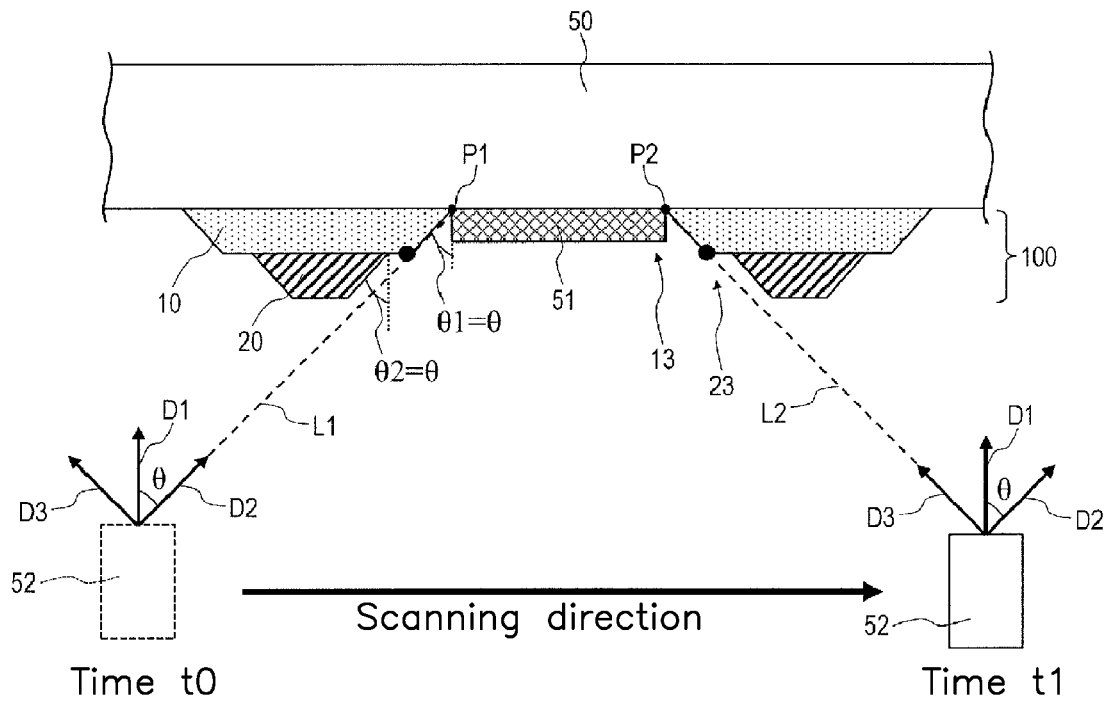
FIG. 5 A diagram schematically showing a vapor deposition step using the vapor deposition mask 100, showing a case in which the inner wall surfaces of an opening 13 and a slit 23 are tapered.

Referring to FIG. 4 and FIG. 5, the reason why the occurrence of shadowing is suppressed when the inner wall surface of the openings 13 and/or the slits 23 is tapered will be described in detail.

FIG. 4 and FIG. 5 are diagrams each schematically showing the vapor deposition step using the vapor deposition mask 100 (the step of forming the vapor deposition film 51 on the substrate 50, which is the work). FIG. 4 shows a case in which the inner wall surface of the openings 13 and the slits 23 is not tapered (i.e., generally parallel to the direction normal to the vapor deposition mask 100), and FIG. 5 shows a case in which the inner wall surface of the openings 13 and the slits 23 is tapered. Note that FIG. 4 and FIG. 5 do not show the depressed/protruding shape on the surface of the resin layer 10 and the metal layer 20.

In the example shown in FIG. 4 and FIG. 5, vapor deposition is performed while a vapor deposition source 52 is moved from left to right relative to the substrate 50 (that is, the scanning direction is left to right). The vapor deposition material is released from the vapor deposition source 52 not only in the direction normal to the vapor deposition mask 100 but also in diagonal directions (directions inclined with respect to the normal direction). Herein, θ denotes the spread angle of the vapor deposition material. D1 denotes the direction normal to the vapor deposition mask 100, D2 denotes a direction that is inclined by θ with respect to the direction D1 toward the scanning direction (i.e., to the right), and D3 denotes a direction that is inclined by θ toward the opposite direction to the scanning direction (i.e., to the left). In the example shown in FIG. 5, the taper angle θ1 of the openings 13 and the taper angle θ2 of the slits 23 are equal to the spread angle θ of the vapor deposition material.

FIG. 4 and FIG. 5 show the position of the vapor deposition source 52 at the start (time t0) of the period in which the vapor deposition film 51 deposits in an opening 13 of the resin layer 10, and the position of the vapor deposition source 52 at the end (time $t_1$) of the period. Time t0 is the time at which the vapor deposition material released from the vapor deposition source 52 starts arriving in the opening 13. At this point, a virtual straight line L1 extending in the direction D2 from the vapor deposition source 52 just passes an edge of the opening 13 on the vapor deposition source 52 side. Time $t_1$ is the time at which the vapor deposition material released from the vapor deposition source 52 stops arriving in the opening 13. At this point, a virtual straight line L2 extending in the direction D3 from the vapor deposition source 52 just passes an edge of the opening 13 on the vapor deposition source 52 side.

In the example shown in FIG. 4, the vapor deposition film 51 is formed to an intended thickness across the region between point P1 that the vapor deposition material reaches at time $t_0$ (the intersection between the virtual straight line L1 and the surface of the substrate 50) and point P2 that the vapor deposition material reaches at time $t_1$ (the intersection between the virtual straight line L2 and the surface of the substrate 50). However, the vapor deposition film 51 is thinner than the intended thickness in the outside region (the region from one end of the opening 13 to point P1 in the scanning direction, and the region from the other end of the opening 13 to point P2 in the scanning direction). Such a portion (a portion formed to be thinner than the intended thickness) is referred to as a shadow. The width w of a shadow is expressed as w=d·tan θ using the thickness d of the resin layer 10 and the spread angle θ of the vapor deposition material. That is, the width w of a shadow is in proportion to the thickness d of the resin layer 10.

In contrast, in the example shown in FIG. 5, point P1 that the vapor deposition material reaches at time t0 and point P2 that the vapor deposition material reaches at time $t_1$ are located on opposite ends of the opening 13 in the scanning direction. Therefore, the vapor deposition film 51 is formed to an intended thickness across the entirety thereof. That is, no shadow is formed. With the inner wall surface of the openings 13 and/or the slits 23 being tapered, as described above, it is possible to suppress the occurrence of shadowing.

Figure 6:
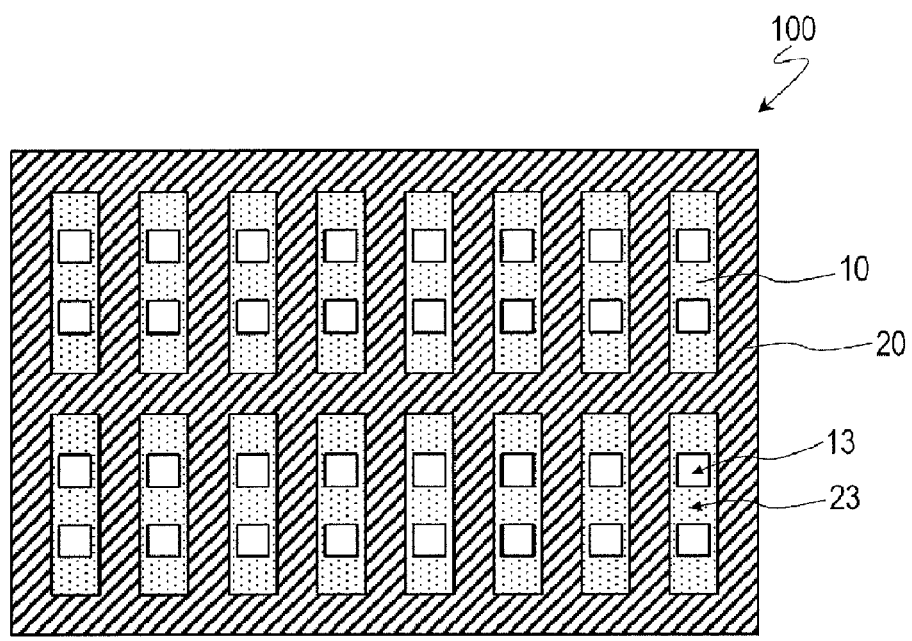
FIG. 6 A plan view showing another configuration example of the vapor deposition mask 100.

FIG. 6 shows another example of the shape of the metal layer 20 as seen from above (the shape as seen from the direction normal to the vapor deposition mask 100). As shown in FIG. 6, the metal layer 20 as a whole may be ladder shaped. That is, two or more slits 23 may be arranged not only in the row direction but also in the column direction. Thus, the metal layer 20 may have any shape as long as a plurality of openings 13 of the resin layer 10 are exposed therethrough and it can sufficiently support the resin layer 10.

(Regarding Rough Surface Region)

As used herein, the "rough surface region" refers to a region having a depressed/protruding shape such that it can be regarded as being substantially not flat. Specifically, the rough surface region is a region where the surface roughness (arithmetic mean roughness) Ra is 50 nm or more.

Figure 7:
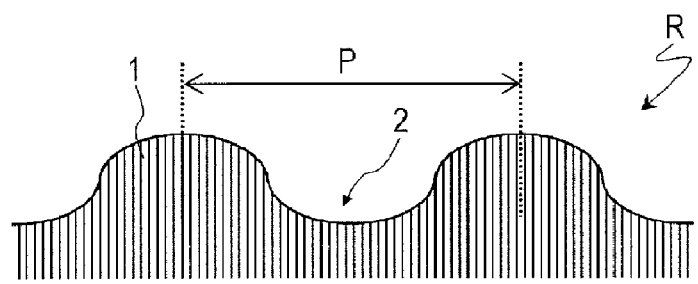
FIG. 7 A cross-sectional view schematically showing a rough surface region R included in the surface of the vapor deposition mask 100.

FIG. 7 shows, on an enlarged scale, a cross-sectional structure of a rough surface region R. As shown in FIG. 7, the rough surface region R has minute protrusions 1 and minute depressions 2. In FIG. 7, the cross-sectional outlines of the protrusions 1 and the depressions 2 are shown to be generally arc-shaped, but the cross-sectional shapes of the protrusions 1 and the depressions 2 are not limited to the illustrated shape.

The rough surface region R can be formed by performing a roughening process on a flat surface of a resin layer or a metal layer (metal plate). The roughening process may be a mechanical roughening process (e.g., a blast process), a chemical roughening process (e.g., an etching process), or a plasma process. When a resin layer is formed from a resin material or when a metal layer (metal plate) is formed from a metal material, it is possible to use a method such that the layer is formed, in the first place, with the rough surface region R on the surface.

In view of sufficiently enhancing the effect of suppressing the peeling of the vapor deposition material and the effect of strengthening the attachment between the resin layer 10 and the metal layer 20, the surface roughness Ra of the rough surface region R is preferably greater than a certain level, and specifically is preferably 0.1 μm or more. Note however that for the rough surface region R of the first primary surface 11 of the resin layer 10, if the surface roughness Ra exceeds 1.5 μm, the formation of the rough surface region R itself may become difficult (it may be difficult to form by a simple method) depending on the thickness of the resin layer 10. Therefore, in view of the ease of forming the rough surface region R, the surface roughness Ra of the rough surface region is preferably 1.5 μm or less.

The effects described above can be assessed also based on the rate of increase in the surface area due to the formation of the rough surface region R (the rate of increase relative to a case in which the surface is flat). In view of sufficiently enhancing the effects described above, the rate of increase in the surface area is preferably 120% or more, and more preferably 150% or more.

There is no particular limitation on the pitch P of the protrusions 1. Note however that when the ratio Ra/P of the surface roughness Ra with respect to the pitch P becomes excessive, it may be difficult to form the rough surface region R by a simple method depending on the shape of the protrusions 1 and the depressions 2. Therefore, Ra/P is preferably less than 1, and more preferably ½ or less.

For a case in which the cross-sectional outlines of the protrusions 1 and the depressions 2 are arc-shaped, the rate of increase in the surface area for a surface roughness Ra of 1 μm and a pitch P of 4 μm (i.e., Ra/P=¼) was calculated to be 157%, indicating that the cleaning cycle can be sufficiently long.

Figure 8:
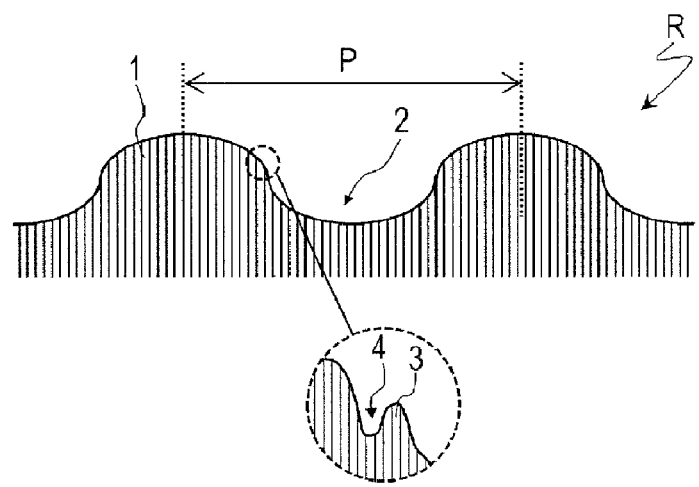
FIG. 8 A cross-sectional view schematically showing a rough surface region R included in the surface of the vapor deposition mask 100.

Depressed/protruding shapes having significantly different sizes may coexist. For example, as shown in FIG. 8, the protrusion 1 and the depression 2 of a relatively large size (e.g., on the μm order) may include a protrusion 3 and a depression 4 of a relatively small size (e.g., on the nm order: specifically, some hundreds of nm). With such a configuration, it is possible to further enhance the effect of suppressing the peeling of the vapor deposition material and the effect of strengthening the attachment between the resin layer 10 and the metal layer 20.

(Method for Manufacturing Vapor Deposition Mask)

Referring to FIGS. 9(a) to 9(e), an example of a method for manufacturing the vapor deposition mask 100 will be described. FIGS. 9(a) to 9(e) are cross-sectional views each showing a step in the process of manufacturing the vapor deposition mask 100.

Figure 9:
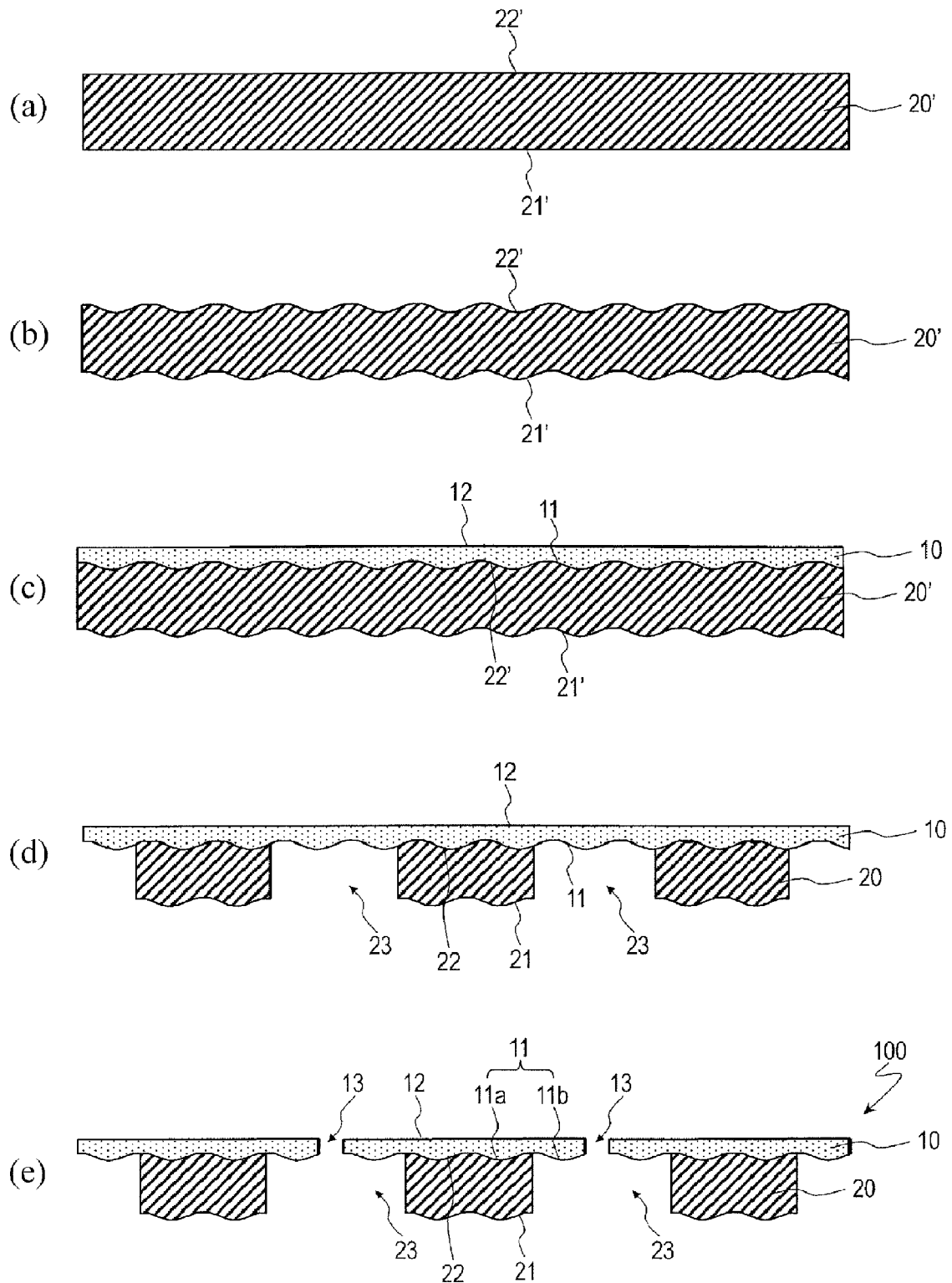
FIG. 9 (a) to (e) are cross-sectional views each showing a step in the process of manufacturing the vapor deposition mask 100.

First, as shown in FIG. 9(a), a support substrate 20' having two primary surfaces 21' and 22' opposite to each other is provided. Herein, a metal plate is provided as the support substrate 20'.

Next, as shown in FIG. 9(b), a roughening process is performed on each of the primary surfaces 21' and 22' of the metal plate 20', thereby forming a rough surface region having a depressed/protruding shape. Any of various roughening processes known in the art may be used as the roughening process. When a sand blast process is performed as the roughening process, for example, it is possible to form a depressed/protruding shape of an intended size by adjusting the particle size of the shot material, etc. When forming a structure shown in FIG. 8 (a structure in which depressed/protruding shapes having significantly different sizes coexist), the process may be performed in a plurality of shots while varying the particle size of the shot material.

Then, as shown in FIG. 9(c), by applying a resin material on one (22') of the primary surfaces 21' and 22' of the metal plate 20', thereby forming the resin layer 10. Herein, it is possible to form the resin layer 10 by applying, and then curing, a resin material dissolved in a solvent on the primary surface 22'. At this point, the depressed/protruding shape of the rough surface region of the metal plate 20' has been transferred onto the surface (the surface on the metal plate 20' side) 11 of the obtained resin layer 10. The surface 12 of the resin layer 10 opposite from the metal plate 20' can be made flat by leveling. The surface 11 of the resin layer 10 onto which the depressed/protruding shape has been transferred and the flat surface 12 thereof are to be the first primary surface 11 and the second primary surface 12 of the resin layer 10 of the final vapor deposition mask 100.

Next, as shown in FIG. 9(d), the metal plate 20' is patterned (forming a plurality of slits 23), thereby obtaining the metal layer 20 having a predetermined shape. Patterning of the metal plate 20' can be performed by a photolithography process, for example. The two primary surfaces 21' and 22' of the metal plate 20' are to be the third primary surface 21 and the fourth primary surface 22, respectively, of the metal layer 20.

Then, as shown in FIG. 9(e), a plurality of openings 13 are formed in the resin layer 10. The formation of the openings 13 can be done by a laser process, for example. The vapor deposition mask 100 is obtained as described above.

With the manufacturing method described above, the depressed/protruding shape of the rough surface region of the support substrate (metal plate) 20' is transferred onto the surface 11 of the resin layer 10. Thus, it is possible to form the depressed/protruding shape (rough surface region) without separately performing a roughening process on the surface 11 of the resin layer 10. Since the support substrate (metal plate) 20', which is the transferred source pattern, becomes the metal layer 20 of the vapor deposition mask 100, the non-exposed portion 11a of the first primary surface 11 of the resin layer 10 and the fourth primary surface 22 of the metal layer 20 have depressed/protruding shapes complementary to each other. Thus, the resin layer 10 and the metal layer 20 can be firmly attached together.

Note that a support substrate other than the metal plate 20' may be used as the transferred source pattern. Referring to FIGS. 10(a) to 10(g), another example of a method for manufacturing the vapor deposition mask 100 will be described. FIGS. 10(a) to 10(g) are cross-sectional views each showing a step in the process of manufacturing the vapor deposition mask 100.

Figure 10:
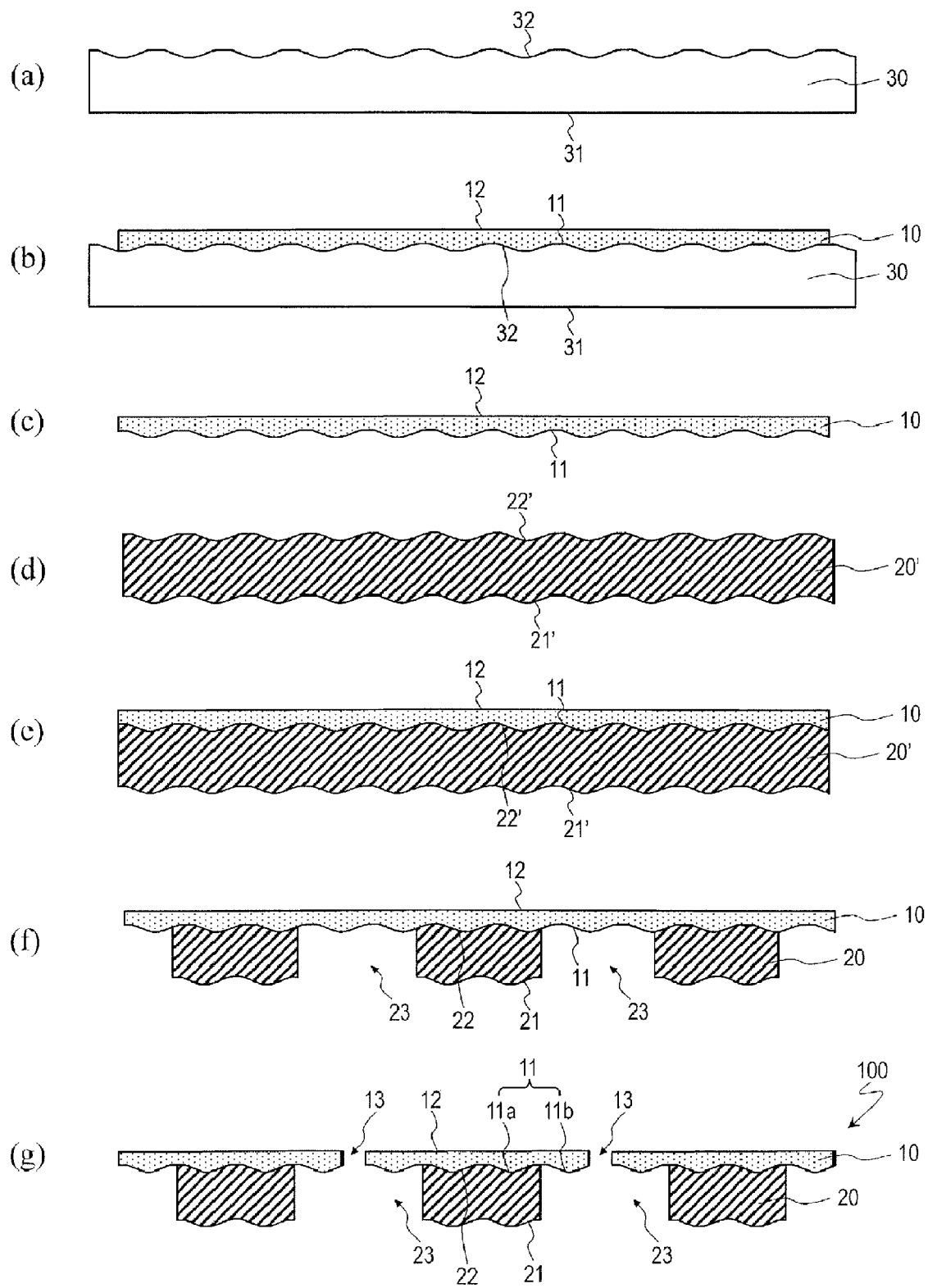
FIG. 10 (a) to (g) are cross-sectional views each showing a step in another example of the process of manufacturing the vapor deposition mask 100.

First, as shown in FIG. 10(a), a support substrate 30 having two primary surfaces 31 and 32 opposite to each other is provided. Herein, a glass substrate, of which one (32) of the two primary surfaces 31 and 32 includes a rough surface region, is provided as the support substrate 30. The glass substrate 30 can be obtained by performing a roughening process on one of the primary surfaces of a glass substrate that has two flat primary surfaces. Any of various roughening processes known in the art may be used as the roughening process.

Next, as shown in FIG. 10(b), a resin material is applied on the primary surface 32 including a roughened region of the glass substrate 30, thereby forming the resin layer 10. For example, it is possible to form the resin layer 10 by applying, and then curing, a resin material dissolved in a solvent on the primary surface 32. At this point, the depressed/protruding shape of the rough surface region of the glass substrate 30 has been transferred onto the surface (the surface on the glass substrate 30 side) 11 of the resin layer 10 obtained. The surface 12 of the resin layer 10 opposite from the glass substrate 30 can be made flat by leveling. The surface 11 of the resin layer 10 onto which the depressed/protruding shape has been transferred and the flat surface 12 thereof are to be the first primary surface 11 and the second primary surface 12 of the resin layer 10 of the final vapor deposition mask 100.

Then, as shown in FIG. 10(c), the resin layer 10 is removed from the glass substrate 30. The removing of the resin layer 10 can be done by a laser lift off method, for example. When the adhesion force between the resin layer 10 and the glass substrate 30 is relatively weak, the removing can be done mechanically by using a knife edge, or the like. The adhesion force between the resin layer 10 and the glass substrate 30 can be weakened by adjusting the conditions for forming the resin layer 10 (the curing temperature, etc.) or performing a surface treatment (a water-repellant treatment, or the like) on the glass substrate 30. Since the resin layer 10 may be removed immediately (without performing any other step) after being formed on the glass substrate 30, the adhesion force between the resin layer 10 and the glass substrate 30 does not need to be strong.

Separately from obtaining the resin layer 10 as described above, the metal plate 20' having two primary surfaces 21' and 22' opposite to each other is provided, as shown in FIG. 10(d). The primary surfaces 21' and 22' of the metal plate 20' each include a rough surface region having a depressed/protruding shape.

Next, as shown in FIG. 10(e), the resin layer 10 is attached to the metal plate 20' so that the surface 11, onto which the depressed/protruding shape has been transferred, is located on the metal plate 20' side. For example, the resin layer 10 is bonded to the metal plate 20' by an adhesive.

Then, as shown in FIG. 10(f), the metal plate 20' is patterned (forming a plurality of slits 23), thereby obtaining the metal layer 20 having a predetermined shape. Patterning of the metal plate 20' can be performed by a photolithography process, for example. The two primary surfaces 21' and 22' of the metal plate 20' are to be the third primary surface 21 and the fourth primary surface 22, respectively, of the metal layer 20.

Then, as shown in FIG. 10(g), a plurality of openings 13 are formed in the resin layer 10. The formation of the openings 13 can be done by a laser process, for example. The vapor deposition mask 100 is obtained as described above.

With the manufacturing method described above with reference to FIGS. 10(a) to 10(g), the support substrate (glass substrate) 30, which is the transferred source pattern of the depressed/protruding shape, can be used repeatedly. Therefore, once a depressed/protruding shape is formed, with intended specifications, on the surface of the support substrate 30, it is thereafter possible, with a good repeatability, to form a depressed/protruding shape with intended specifications on the surface 11 of the resin layer 10. With the vapor deposition mask 100 of the present embodiment, since it is only required that the size/shape of the metal layer 20 be such that it can function as a support, the ratio of the first primary surface 11 of the resin layer 10 with respect to the surface on the vapor deposition source side may be higher than the ratio of the third primary surface 21 of the metal layer 20. Therefore, if it is possible, with a good repeatability, to form a depressed/protruding shape on the surface 11 of the resin layer 10, it is possible to stably realize the advantageous effects of the vapor deposition mask 100 of the present embodiment.

Note that the manufacturing method described above with reference to FIGS. 10(a) to 10(g) may use a support substrate other than a glass substrate.

(Method for Manufacturing Organic Semiconductor Device)

The vapor deposition mask 100 according to an embodiment of the present invention can suitably be used in the vapor deposition step in a method for manufacturing an organic semiconductor device.

The following description is directed to, as an example, a method for manufacturing an organic EL display device.

Figure 11:
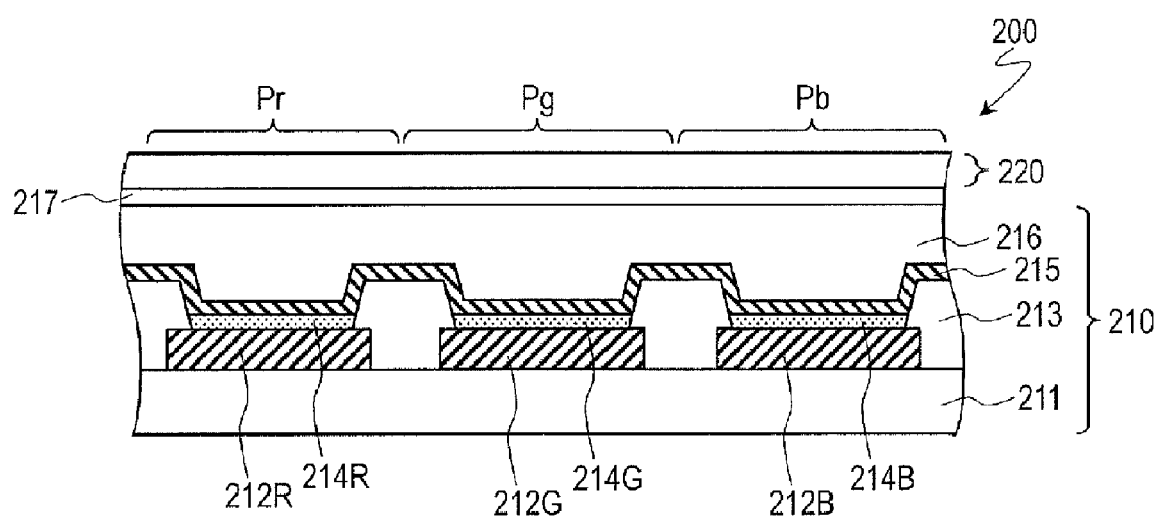
FIG. 11 A cross-sectional view schematically showing an organic EL display device 200 of a top emission type.

FIG. 11 is a cross-sectional view schematically showing an organic EL display device 200 of a top emission type.

As can be seen from FIG. 11, the organic EL display device 200 includes an active matrix substrate (TFT substrate) 210 and an encapsulation substrate 220, and includes a red pixel Pr, a green pixel Pg and a blue pixel Pb.

The TFT substrate 210 includes an insulative substrate, and a TFT circuit formed on the insulative substrate (neither is shown in the figure). A flattening film 211 is provided so as to cover the TFT circuit. The flattening film 211 is formed from an organic insulative material.

Lower electrodes 212R, 212G and 212B are provided on the flattening film 211. The lower electrodes 212R, 212G and 212B are formed in the red pixel Pr, the green pixel Pg and the blue pixel Pb, respectively. The lower electrodes 212R, 212G and 212B are each connected to the TFT circuit, and function as an anode. A bank 213 covering the edge portion of the lower electrodes 212R, 212G and 212B is provided between adjacent pixels. The bank 213 is formed from an insulative material.

Organic EL layers 214R, 214G and 214B are provided on the lower electrodes 212R, 212G and 212B of the red pixel Pr, the green pixel Pg and the blue pixel Pb, respectively. The organic EL layers 214R, 214G and 214B each have a layered structure including a plurality of layers formed from an organic semiconductor material. For example, the layered structure includes a hole injection layer, a hole transport layer, a light emitting layer, an electron transport layer and an electron injection layer that are arranged in this order from the side of the lower electrodes 212R, 212G and 212B. The organic EL layer 214R of the red pixel Pr includes a light emitting layer that emits red light. The organic EL layer 214G of the green pixel Pg includes a light emitting layer that emits green light. The organic EL layer 214B of the blue pixel Pb includes a light emitting layer that emits blue light.

An upper electrode 215 is provided on the organic EL layers 214R, 214G and 214B. The upper electrode 215 is formed, by using a transparent conductive material, so as to be continuous over the entire display area (i.e., as a shared member among the red pixel Pr, the green pixel Pg and the blue pixel Pb), and functions as a cathode. A protection layer 216 is provided on the upper electrode 215. The protection layer 216 is formed from an organic insulative material.

The structure of a TFT substrate 210 described above is encapsulated by the encapsulation substrate 220, which is bonded to the TFT substrate 210 via a transparent resin layer 217.

The organic EL display device 200 can be produced as follows by using the vapor deposition mask 100 according to an embodiment of the present invention. FIGS. 12(a) to 12(d) and FIGS. 13(a) to 13(d) are cross-sectional views each showing a step in the process of manufacturing the organic EL display device 200. Note that the following description will focus on the step of vapor-depositing an organic semiconductor material on the work (forming the organic EL layers 214R, 214G and 214B on the TFT substrate 210) by using the vapor deposition mask 100.

Figure 12:
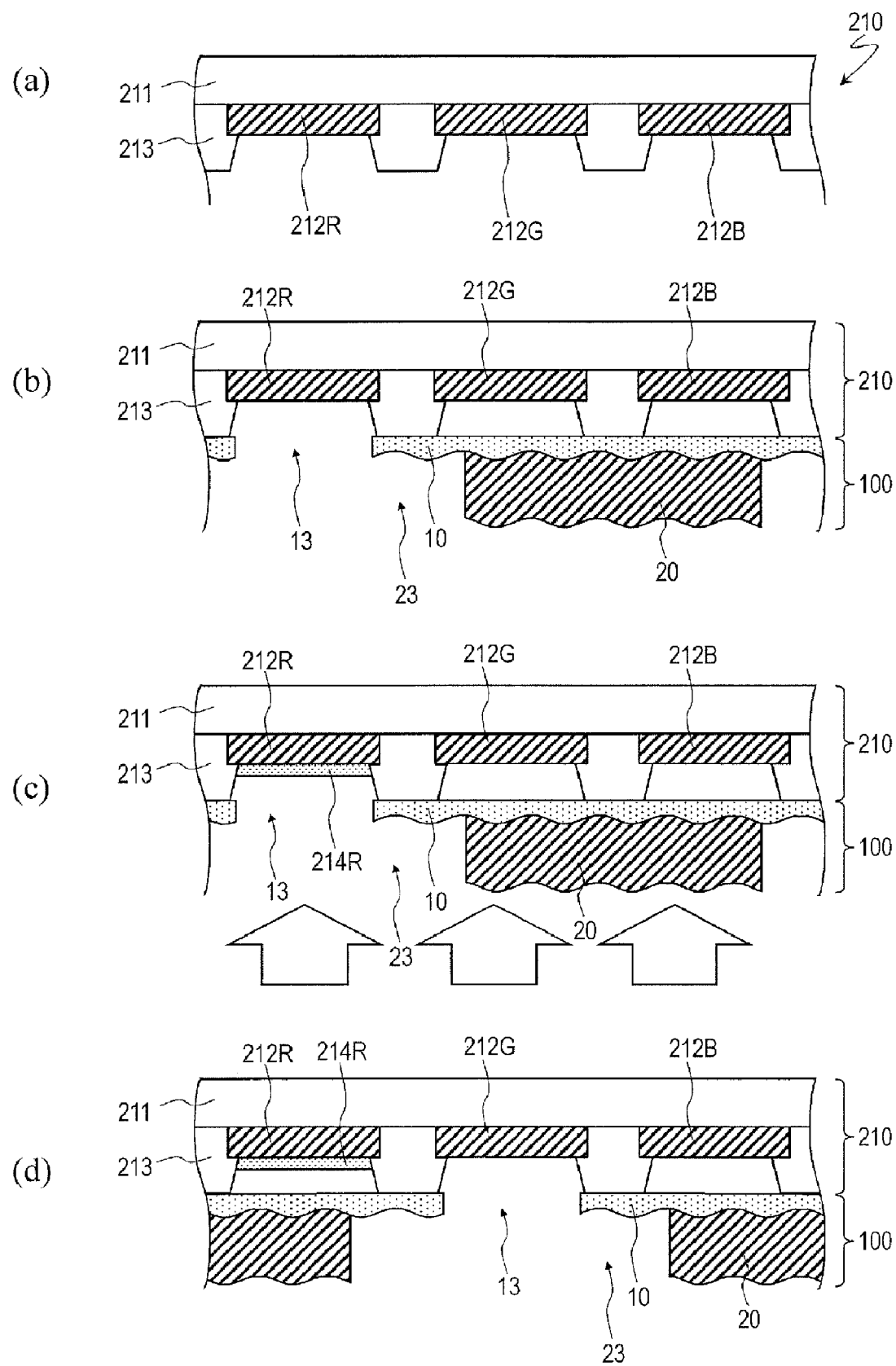
FIG. 12 (a) to (d) are cross-sectional views each showing a step in the process of manufacturing the organic EL display device 200.

First, as shown in FIG. 12(a), the TFT substrate 210 is provided, wherein the TFT substrate 210 includes the TFT circuit, the flattening film 211, the lower electrodes 212R, 212G and 212B and the bank 213 formed on an insulative substrate. The steps of forming the TFT circuit, the flattening film 211, the lower electrodes 212R, 212G and 212B and the bank 213 can be carried out by any of various methods known in the art.

Next, as shown in FIG. 12(b), a carrier device is used to arrange the TFT substrate 210 close to the vapor deposition mask 100, which is held in the vacuum vapor deposition device. In this process, the vapor deposition mask 100 and the TFT substrate 210 are positioned so that the opening 13 of the resin layer 10 overlaps the lower electrode 212R of the red pixel Pr. A magnetic chuck (not shown) arranged on the opposite side from the vapor deposition mask 100 with respect to the TFT substrate 210 is used to hold the vapor deposition mask 100 in close contact with the TFT substrate 210.

Then, as shown in FIG. 12(c), organic semiconductor materials are successively deposited on the lower electrode 212R of the red pixel Pr by vacuum vapor deposition, thereby forming the organic EL layer 214R including a light emitting layer that emits red light. In this process, the organic semiconductor material deposits also on the surface of the vapor deposition mask 100 that is on the vapor deposition source side (the opposite side from the TFT substrate 210, which is the work).

Next, as shown in FIG. 12(d), the TFT substrate 210 is shifted by the carrier device by one pixel pitch so as to position the vapor deposition mask 100 and the TFT substrate 210 so that the opening 13 of the resin layer 10 overlaps the lower electrode 212G of the green pixel Pg. A magnetic chuck is used to hold the vapor deposition mask 100 in close contact with the TFT substrate 210.

Figure 13:
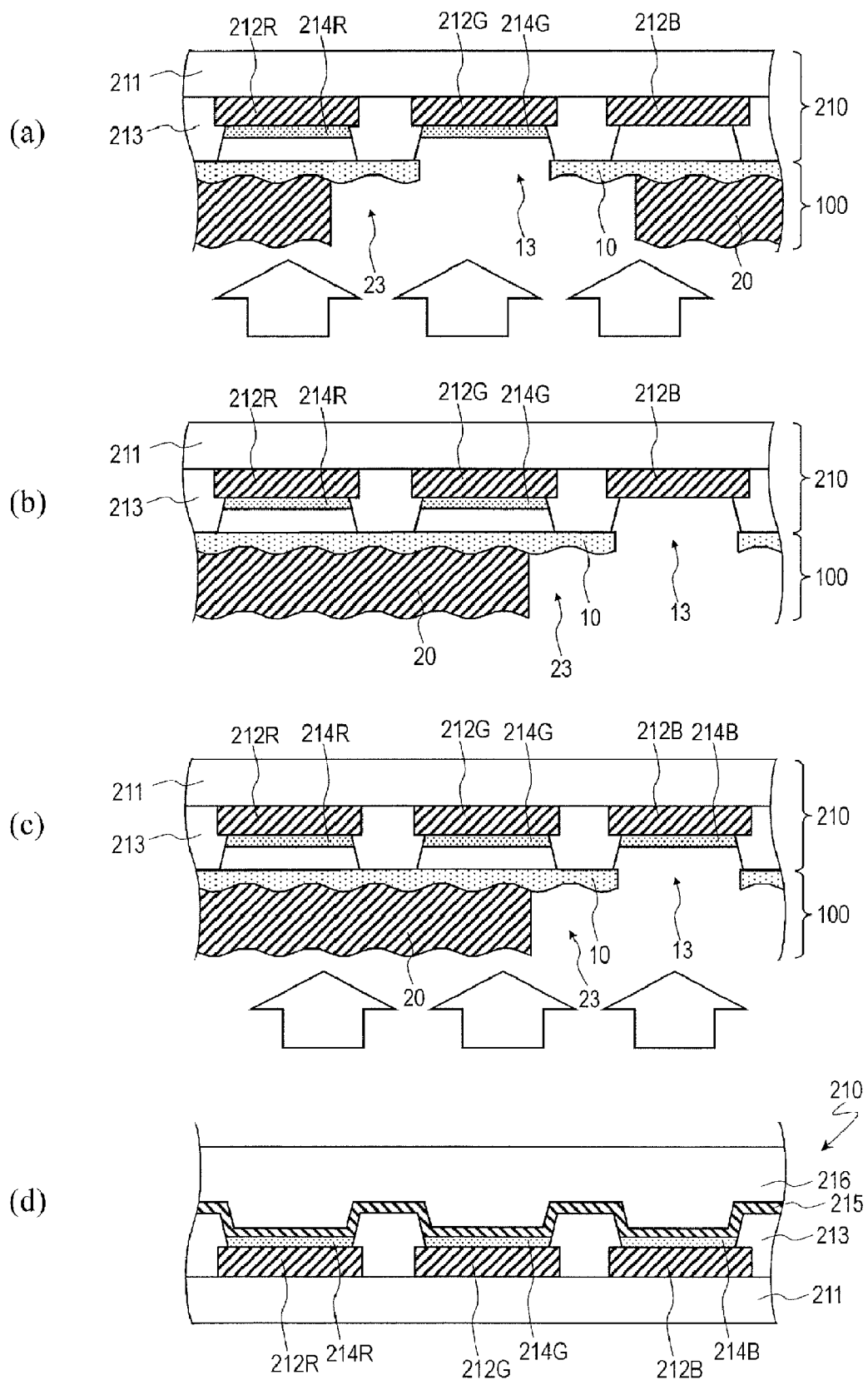
FIG. 13 (a) to (d) are cross-sectional views each showing a step in the process of manufacturing the organic EL display device 200.

Then, as shown in FIG. 13(a), organic semiconductor materials are successively deposited on the lower electrode 212G of the green pixel Pg by vacuum vapor deposition, thereby forming the organic EL layer 214G including a light emitting layer that emits green light. In this process, the organic semiconductor material deposits also on the surface of the vapor deposition mask 100 that is on the vapor deposition source side.

Next, as shown in FIG. 13(b), the TFT substrate 210 is shifted by the carrier device by one pixel pitch so as to position the vapor deposition mask 100 and the TFT substrate 210 so that the opening 13 of the resin layer 10 overlaps the lower electrode 212B of the blue pixel Pb. A magnetic chuck is used to hold the vapor deposition mask 100 in close contact with the TFT substrate 210.

Then, as shown in FIG. 13(c), organic semiconductor materials are successively deposited on the lower electrode 212B of the blue pixel Pb by vacuum vapor deposition, thereby forming the organic EL layer 214B including a light emitting layer that emits blue light. In this process, the organic semiconductor material deposits also on the surface of the vapor deposition mask 100 that is on the vapor deposition source side.

Next, as shown in FIG. 13(d), the upper electrode 215 and the protection layer 216 are formed successively on the organic EL layers 214R, 214G and 214B. The formation of the upper electrode 215 and the protection layer 216 can be carried out by any of various methods known in the art. Thus, the TFT substrate 210 is obtained.

Then, an encapsulation substrate 220 is bonded to the TFT substrate 210 via the transparent resin layer 217, thereby completing the organic EL display device 200 shown in FIG. 11.

Note that although the description herein is directed to an example in which the organic EL layers 214R, 214B and 214G corresponding to the red pixel Pr, the green pixel Pg and the blue pixel Pr, respectively, are formed by successively shifting a single vapor deposition mask 100, three vapor deposition masks 100 corresponding respectively to the organic EL layers 214R, 214B and 214G of the red pixel Pr, the green pixel Pg and the blue pixel Pr may be used. When the organic EL layers 214R, 214B and 214G of the red pixel Pr, the green pixel Pg and the blue pixel Pr have the same size/shape, a single vapor deposition mask 100 may be used to form all the organic EL layers 214R, 214B and 214G as illustrated herein.

As already described above, in the vapor deposition step shown in FIG. 12(c), FIGS. 13(a) and 13(c) (the step of forming the organic EL layers 214R, 214G and 214B by vacuum vapor deposition), the vapor deposition material deposits also on the surface of the vapor deposition mask 100 that is on the vapor deposition source side. When the deposited vapor deposition material reaches a predetermined thickness set in advance, the vapor deposition mask 100 is cleaned. For example, when the predetermined thickness is set to 1 μm and a film of about 30 nm is deposited in a single vapor deposition, cleaning is performed after every 33 iterations of vapor deposition. The cleaning of the vapor deposition mask 100 is executed by successively performing ultrasonic wet cleaning, rinsing with pure water and depressurized drying, for example.

As already described above, when the vapor deposition mask 100 of the present embodiment is used, the vapor deposition material deposited on the vapor deposition source side surface in the vapor deposition step is less likely to come off owing to the anchoring effect. Therefore, the cleaning cycle can be set longer as compared with conventional methods. Therefore, it is possible to elongate the life of the vapor deposition mask 100.

Note that although the organic EL display device 200 of a top emission type is illustrated in the above description, it is needless to say that the vapor deposition mask 100 of the present embodiment may be used for manufacturing an organic EL display device of a bottom emission type.

An organic EL display device to be manufactured by using the vapor deposition mask 100 of the present embodiment does not necessarily need to be a rigid device. The vapor deposition mask 100 of the present embodiment can suitably be used in the manufacture of a flexible organic EL display device. In a method for manufacturing a flexible organic EL display device, a TFT circuit, etc., are formed on a polymer layer (e.g., a polyimide layer) formed on a support substrate (e.g., a glass substrate), and the polymer layer, together with the layered structure thereon, is removed from the support substrate (e.g., a laser lift off method is used) after the formation of a protection layer. An encapsulation film is used instead of an encapsulation substrate for encapsulating the TFT substrate.

The vapor deposition mask of the present embodiment may be also used in the manufacture of an organic semiconductor device other than an organic EL display device, and can particularly suitably be used in the manufacture of an organic semiconductor device for which it is necessary to form a vapor deposition pattern having a high definition.

INDUSTRIAL APPLICABILITY

The vapor deposition mask according to an embodiment of the present invention can suitably be used in the manufacture of an organic semiconductor device such as an organic EL display device, and can particularly suitably be used in the manufacture of an organic semiconductor device for which it is necessary to form a vapor deposition pattern having a high definition.

REFERENCE SIGNS LIST 1, 3 Protrusion
2, 4 Depression
10 Resin layer
11 First primary surface
11a Non-exposed portion of first primary surface
11b Exposed portion of first primary surface
12 Second primary surface
13 Opening
20 Metal layer
20' Metal plate (support substrate)
21 Third primary surface
22 Fourth primary surface
23 Slit
30 Glass substrate (support substrate)
100 Vapor deposition mask
200 Organic EL display device
210 TFT substrate
211 Flattening film
212R, 212G, 212B Lower electrode (anode)
213 Bank
214R, 214G, 214B Organic EL layer
215 Upper electrode
216 Protection layer
217 Transparent resin layer
220 Encapsulation substrate
Pr Red pixel
Pg Green pixel
Pb Blue pixel

The invention claimed is:

1. A vapor deposition mask comprising:
a resin layer having a first primary surface and a second primary surface, and having a plurality of openings; and
a metal layer having a third primary surface and a fourth primary surface, and provided on the first primary surface of the resin layer so that the fourth primary surface is located on the resin layer side, wherein the metal layer is shaped so that the plurality of openings are exposed therethrough, wherein:
a portion of the first primary surface of the resin layer that is in contact with the metal layer, a portion of the first primary surface of the resin layer that is not in contact with the metal layer, and the third primary surface of the metal layer each include a rough surface region having a depressed/protruding shape; and
the second primary surface of the resin layer does not include a rough surface region having a depressed/protruding shape.

2. The vapor deposition mask according to claim 1, wherein the fourth primary surface of the metal layer includes a rough surface region having a depressed/protruding shape.

3. The vapor deposition mask according to claim 2, wherein the depressed/protruding shape of the rough surface region of the portion of the first primary surface of the resin layer that is in contact with the metal layer and the depressed/protruding shape of the rough surface region of the fourth primary surface of the metal layer are complementary to each other.

4. The vapor deposition mask according to claim 1, wherein the rough surface region of the portion of the first primary surface of the resin layer that is in contact with the metal layer, the rough surface region of the portion of the first primary surface of the resin layer that is not in contact with the metal layer, and the rough surface region of the third primary surface of the metal layer each have a surface roughness Ra of 0.1 μm or more.

5. A method for manufacturing a vapor deposition mask comprising a resin layer having a plurality of openings and a metal layer provided on the resin layer and shaped so that the plurality of openings are exposed therethrough, the method comprising the steps of:
providing a support substrate having a first primary surface and a second primary surface, wherein at least the first primary surface, of the first primary surface and the second primary surface, includes a rough surface region having a depressed/protruding shape;
forming a resin layer having a surface onto which the depressed/protruding shape of the rough surface region of the first primary surface has been transferred, by applying a resin material on the first primary surface of the support substrate, the resin layer having a surface which does not include a rough surface region having a depressed/protruding shape; and
forming a plurality of openings in the resin layer.

6. The method for manufacturing a vapor deposition mask according to claim 5, wherein:
the support substrate is a metal plate of which the first primary surface and the second primary surface each include the rough surface region; and
the method further comprises, after the step of forming the resin layer, a step of patterning the metal plate so as to obtain a metal layer having a predetermined shape.

7. The method for manufacturing a vapor deposition mask according to claim 5, further comprising the steps of:
removing the resin layer from the support substrate;
providing a metal plate having a third primary surface and a fourth primary surface, wherein the third primary surface and the fourth primary surface each include a rough surface region having a depressed/protruding shape;
attaching the resin layer that has been removed from the support substrate to the metal plate so that the surface onto which the depressed/protruding shape has been transferred is located on the metal plate side; and patterning the metal plate so as to obtain a metal layer having a predetermined shape.

8. The method for manufacturing a vapor deposition mask according to claim 7, wherein the support substrate is a glass substrate.

9. A method for manufacturing an organic semiconductor device comprising the step of vapor-depositing an organic semiconductor material on a work by using the vapor deposition mask according to claim 1.

10. A vapor deposition mask comprising:
a resin layer having a first primary surface and a second primary surface, and having a plurality of openings; and
a metal layer having a third primary surface and a fourth primary surface, and provided on the first primary surface of the resin layer so that the fourth primary surface is located on the resin layer side, wherein the metal layer is shaped so that the plurality of openings are exposed therethrough, wherein:
a portion of the first primary surface of the resin layer that is in contact with the metal layer, a portion of the first primary surface of the resin layer that is not in contact with the metal layer, and the third primary surface of the metal layer each include a rough surface region having a depressed/protruding shape, and the rough surface region is a region where an arithmetic mean roughness is 50 nm or more.

11. The vapor deposition mask according to claim 10, wherein the fourth primary surface of the metal layer includes a rough surface region having a depressed/protruding shape.

12. The vapor deposition mask according to claim 11, wherein the depressed/protruding shape of the rough surface region of the portion of the first primary surface of the resin layer that is in contact with the metal layer and the depressed/protruding shape of the rough surface region of the fourth primary surface of the metal layer are complementary to each other.

13. The vapor deposition mask according to claim 10, wherein the second primary surface of the resin layer does not include a rough surface region having a depressed/protruding shape.

14. The vapor deposition mask according to claim 10, wherein the rough surface region of the portion of the first primary surface of the resin layer that is in contact with the metal layer, the rough surface region of the portion of the first primary surface of the resin layer that is not in contact with the metal layer, and the rough surface region of the third primary surface of the metal layer each have a surface roughness Ra of 0.1 µm or more.

15. A method for manufacturing an organic semiconductor device comprising the step of vapor-depositing an organic semiconductor material on a work by using the vapor deposition mask according to claim 10.

* * * * *